United States Patent
Yamada

(10) Patent No.: US 7,450,460 B2
(45) Date of Patent: Nov. 11, 2008

(54) VOLTAGE CONTROL CIRCUIT AND SEMICONDUCTOR DEVICE

(75) Inventor: Shigekazu Yamada, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 248 days.

(21) Appl. No.: 11/166,575

(22) Filed: Jun. 24, 2005

(65) Prior Publication Data

US 2006/0002200 A1    Jan. 5, 2006

Related U.S. Application Data

(63) Continuation of application No. PCT/JP2004/008997, filed on Jun. 25, 2004.

(51) Int. Cl.
*G11C 7/00* (2006.01)
*G11C 7/10* (2006.01)
*G11C 5/14* (2006.01)

(52) U.S. Cl. .............. 365/226; 365/189.09; 365/189.02

(58) Field of Classification Search ........ 365/226, 365/189.09, 189.02, 185.03; 327/94, 148, 327/157, 390, 407, 408, 538, 541, 543, 534, 327/536, 589; 326/17; 341/153
See application file for complete search history.

(56) References Cited

U.S. PATENT DOCUMENTS 5,291,446 A    3/1994  Van Buskirk et al. .. 365/189.09
5,608,345 A *  3/1997  Macbeth et al. ............. 327/337
5,952,890 A *  9/1999  Fallisgaard et al. .......... 331/18
6,166,950 A * 12/2000  Yamada et al. ......... 365/185.03
6,172,576 B1* 1/2001  Endo et al. .............. 331/116 R
6,559,730 B1* 5/2003  Marvin et al. ............... 331/158
6,815,996 B1* 11/2004  Hsiao ......................... 327/337
2002/0000865 A1  1/2002  Tanzawa ..................... 327/333
2003/0041084 A1* 2/2003  Langan et al. ............... 708/819
2004/0130364 A1* 7/2004  Suzuki ........................ 327/157

FOREIGN PATENT DOCUMENTS

| JP | 6-259979 | 9/1994 |
| JP | 11-345118 | 12/1999 |
| JP | 2000-151385 | 5/2000 |
| JP | 2004-110871 | 4/2004 |
| WO | WO 2006001057 A1 * | 1/2006 |

* cited by examiner

*Primary Examiner*—Richard Elms
*Assistant Examiner*—Allison Bernstein

(57) ABSTRACT

A voltage control circuit includes capacitors, first switches that are respectively provided to the capacitors and selectively couple the capacitors with a given node, and second switches that are respectively provided between the first switches and the given node and selectively connect the first switches to the given node.

16 Claims, 8 Drawing Sheets

Fig. 5    3.5 INTERNAL BOOSTER CIRCUIT

VOLTAGE CONTROL CIRCUIT AND SEMICONDUCTOR DEVICE

CROSS REFERENCE TO RELATED APPLICATIONS

This is a continuation of International Application No. PCT/JP2004/008997, filed Jun. 25, 2004.

BACKGROUND OF THE INVENTION

1. Field of the Invention

The present invention relates to a voltage control circuit and a semiconductor device. More particularly, the present invention relates to a voltage control circuit capable of precisely controlling a target to a constant voltage and a semiconductor device including the same.

2. Description of the Related Art

A non-volatile semiconductor memory device operates so that data is written by a programming operation in which a charge is injected into a gate of a memory cell transistor, and is erased by an erase operation in which the charge is removed from the gate. In programming and erasing, the gate, drain and source of the memory cell transistor are supplied with voltages based on operations.

Generally, the injecting of the charge into the gate and the removing thereof need a voltage that is higher than an external power supply voltage supplied from the outside of the non-volatile semiconductor memory device. The high voltage is generated by a booster circuit that boosts the external power supply voltage. The boosted voltage generated by the booster circuit may be dropped due to a current consumption caused in erasing or programming of a memory cell array circuit. It is thus required to monitor the boosted voltage and check whether the given voltage is maintained as needed. A voltage control circuit is used to meet the requirement. This kind of voltage control circuit is proposed in Japanese Patent Application Publication No. 60259979 and U.S. Pat. No. 5,291,446.

There is another voltage control circuit with a capacitance dividing circuit for high-voltage control. FIG. 1 shows a conventional voltage control circuit including a capacitance dividing circuit. As shown in FIG. 1, a conventional voltage control circuit 1 includes a PMOS transistor 2, NMOS transistors 3 through 5, a comparator circuit 6, select transistors 7 through 12, capacitors CA and CB, and capacitors CC through CC32. The capacitor CC has a capacitance denoted as CC, and the capacitor CCk (for example, CC16) has a capacitance equal to k*CC (for example, 16CC). A reference number 13 indicates an internal booster circuit. The select transistors 7 through 12 are respectively NMOS transistors. Symbols Cpara denote source/drain junction parasitic capacitances of the select transistors 7 through 12 (hereinafter, simply referred to as junction parasitic capacitance).

The capacitors CC through CC32 are respectively connected to a node N1 via the select transistors 7 through 12. A divided voltage VPPDIV is produced by capacitance-dividing a boosted voltage VPP. The comparator circuit 6 compares a reference voltage VREF and the divided voltage VPPDIV, and outputs a resultant signal Vout. When the divided voltage VPPDIV is higher than the reference voltage VREF, the signal Vout is, for example, high. This means that the boosted voltage is too high and is thus subjected to a discharge operation that decreases the boosted voltage.

The step programming method binary-counts signals SEL1 through SEL6 that respectively control the gates of the select transistors 7 through 12, so that the boosted voltage VPP can be raised in an equal stepwise fashion. The target voltage of the boosted voltage VPP is calculated in an ideal circuit as follows:

$$VPP=VREF(1+(CB+(CC+2CC+\ldots))/CA) \quad (1)$$

However, since the select transistors 7 through 12 have the junction parasitic capacitances Cpara, the boosted voltage VPP that can be actually produced is written as follows:

$$VPP=VREF(1+(CB+(CC+2CC+\ldots)+Cpara)/CA) \quad (2)$$

The junction parasitic capacitances Cpara of the select transistors 7 through 12 result from the layout. Therefore, it is very difficult to make the boosted voltage VPP equal to the target voltage. As described before, the junction parasitic capacitances of the select transistors increase as an increased number of select transistors is used. For instance, in a case where a capacitance of 3CC is added to the node N1, the signals SEL1 and SEL2 are both high (transistors 7 and 8 are turned ON), and the other transistors are OFF. This causes all the junction capacitances of the four OFF-state transistors corresponding to the unused capacitors CC4 through CC32 to be added to the node N1. This makes it difficult for the conventional voltage control circuit to control and maintain the constant voltage with a precision equal to mV. Thus, the boosted voltage VPP cannot be controlled precisely.

Further, a large total capacitance in the voltage control circuit 1 needs a large size of the reset transistor 3, which may have a leakage current in the OFF state. This makes it difficult to constantly maintain the divided voltage for a long time.

SUMMARY OF THE INVENTION

The present invention has been made taking the above problems into consideration, and has an object to provide a voltage control circuit capable of controlling and maintaining a constant voltage with high precision and a semiconductor device using the same.

Another object of the present invention is to provide a voltage control circuit capable of constantly maintaining a divided voltage for a long time and a semiconductor device having the same.

These objects of the present invention are achieved by a voltage control circuit comprising: capacitors; first switches that are respectively provided to the capacitors and selectively couple the capacitors with a given node; and second switches that are respectively provided between the first switches and the given node and selectively connect the first switches to the given node. The junction capacitances of the first and second switches that may be formed by transistors can be minimized and a potential of the given node can be constantly maintained with high precision.

The voltage control circuit may further include a control circuit generating second control signals applied to the second switches from first control signals applied to the first switches.

The voltage control circuit may further include a control circuit generating second control signals applied to the second switches from first control signals applied to the first switches so that the first and second switches select capacitors to be connected to the given node from among the capacitors. The capacitors are selectively coupled to the given node by controlling the first and second switches.

The voltage control circuit may be configured so that: one of the first switches that selects one of the capacitors is coupled with the given node via a corresponding one of the second switches; and another one of the first switches that selects another one of the capacitors is coupled to the given node via one of the second switches associated with said another one of the first switches and the corresponding one of the second switches.

The voltage control circuit may be configured so that the capacitors include a capacitor having a minimum capacitance and capacitors having capacitances equal to powers of the minimum capacitance.

The voltage control circuit may be configured so that each of the first and second switches includes a transistor having a gate that is set at a potential defined by boosting an external voltage. The gate of the reset transistor can be supplied with the boosted voltage derived from the external voltage in addition to the advantages such that the transistor junction capacitances can be further reduced and the constant voltage can be accurately controlled and maintained.

The voltage control circuit may further include a voltage dividing circuit that applies, to the given node, a given voltage obtained by dividing a first potential applied to a first terminal. The voltage control circuit may further include a voltage dividing circuit that applies, to the given node, a given voltage obtained by dividing a first potential applied to a first terminal, wherein the voltage dividing circuit comprises a transistor coupled between the first potential and the given node. The voltage control circuit may further include a reset circuit that resets the given node in response to a reset signal.

The voltage control circuit may further include a reset transistor that resets the given node in response to a reset signal, wherein the reset transistor is backward-biased in the absence of the reset signal. The leakage current can be minimized and the constant voltage can be maintained for a long time by back-biasing the gate of the reset transistor connected to the node.

The present invention includes a voltage control circuit comprising: capacitors; first switches that are respectively provided to the capacitors and selectively couple the capacitors with a given node; and a reset transistor that resets the given node in response to a reset signal, the reset transistor being back-biased in the absence of the reset signal. The leakage current can be minimized and the constant voltage can be maintained for a long time by back-biasing the gate of the reset transistor connected to the node.

The voltage control circuit may be configured so that the first switches respectively comprise first transistors having gates to which a gate voltage is applied, the gate voltage being derived from an external voltage and being higher than the external voltage. The transistor junction capacitances can be further reduced and the constant voltage can be accurately controlled and maintained. Further, the gate of the reset transistor can be supplied with the boosted voltage derived from the external voltage.

The voltage control circuit may be configured so that the reset transistor has a gate which to which a gate voltage is applied, the gate voltage being derived from an external voltage and being higher than the external voltage.

The present invention includes a semiconductor device comprising: an array of memory cells; a first booster circuit producing a first voltage applied to the array from an external voltage; and a first voltage control circuit controlling the first voltage produced by the first booster circuit, wherein the first voltage control circuit is configured as described above. It is thus possible to provide the semiconductor device in which a constant voltage to the memory cells.

The semiconductor device may be configured so that the memory cells have multiple threshold values. Data can be written into the multi-bit memory cells with high precision. The semiconductor device may be a non-volatile semiconductor memory device.

The present invention includes a method comprising the steps of: controlling first switches that are provided for capacitors and selectively connect the capacitors to a given node; and controlling second switches that are provided between the first switches and a given node and connecting the first switches to the given node.

The method may further include a step of producing, from a first control signal applied to the first switches, a second control signal applied to the second switches. The method may further include a step of back-biasing a reset transistor that resets the given node in response to a reset signal when the reset signal is not applied thereto.

The present invention includes a method comprising the steps of: controlling first switches that are provided for capacitors and selectively connect the capacitors to a given node; and back-biasing a reset transistor that resets the given node in response to a reset signal when the reset signal is not applied thereto. The method may further include a step of setting gates of transistors included in the first and second switches to a potential defined by boosting an external voltage.

BRIEF DESCRIPTION OF THE DRAWINGS

Preferred embodiments of the present invention will be described in detail based on the following figures, wherein.

DESCRIPTION OF THE PREFERRED EMBODIMENTS

Figure 1:
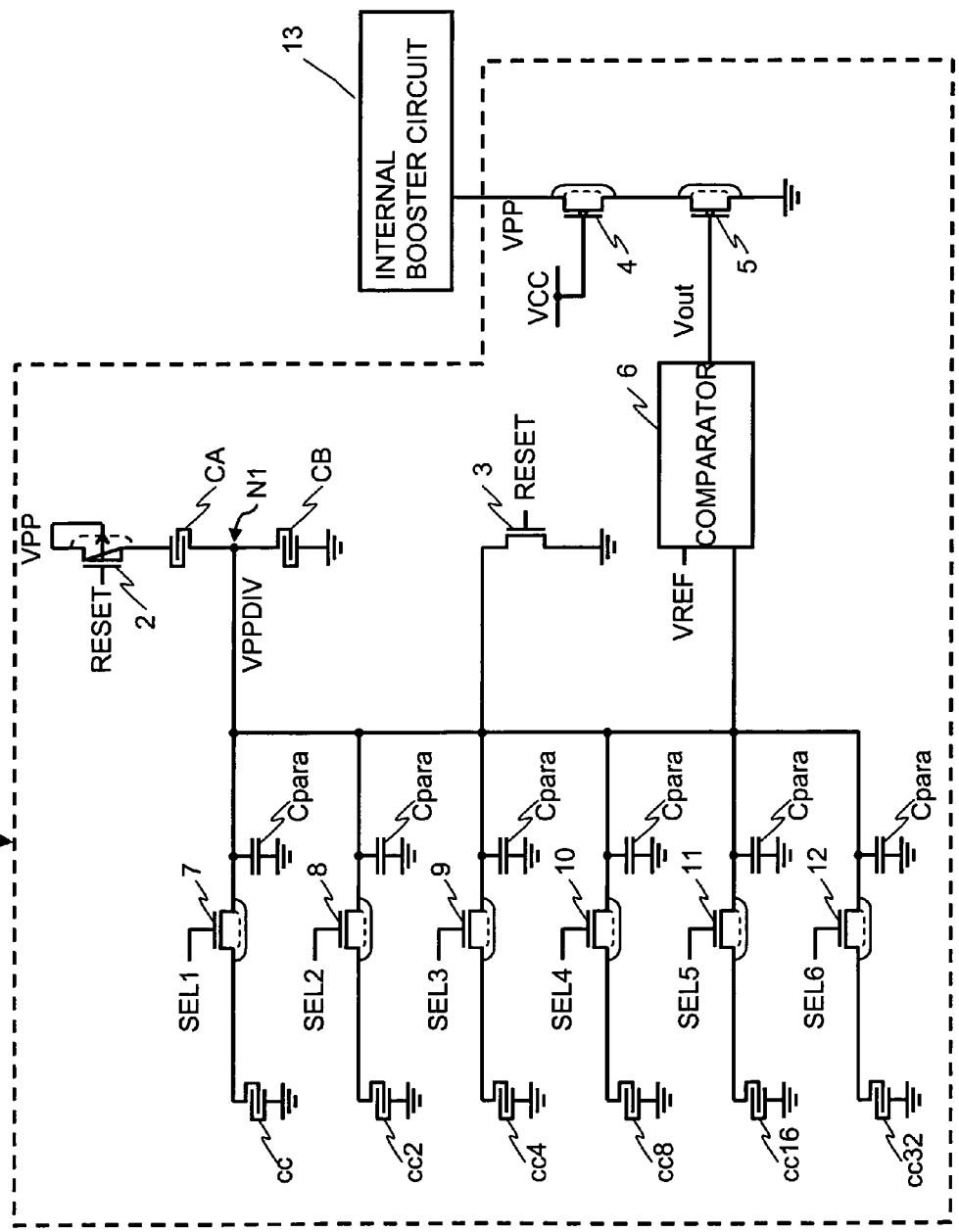
FIG. 1 is a diagram of a conventional voltage control circuit that includes a capacitance dividing circuit.
Figure 2:
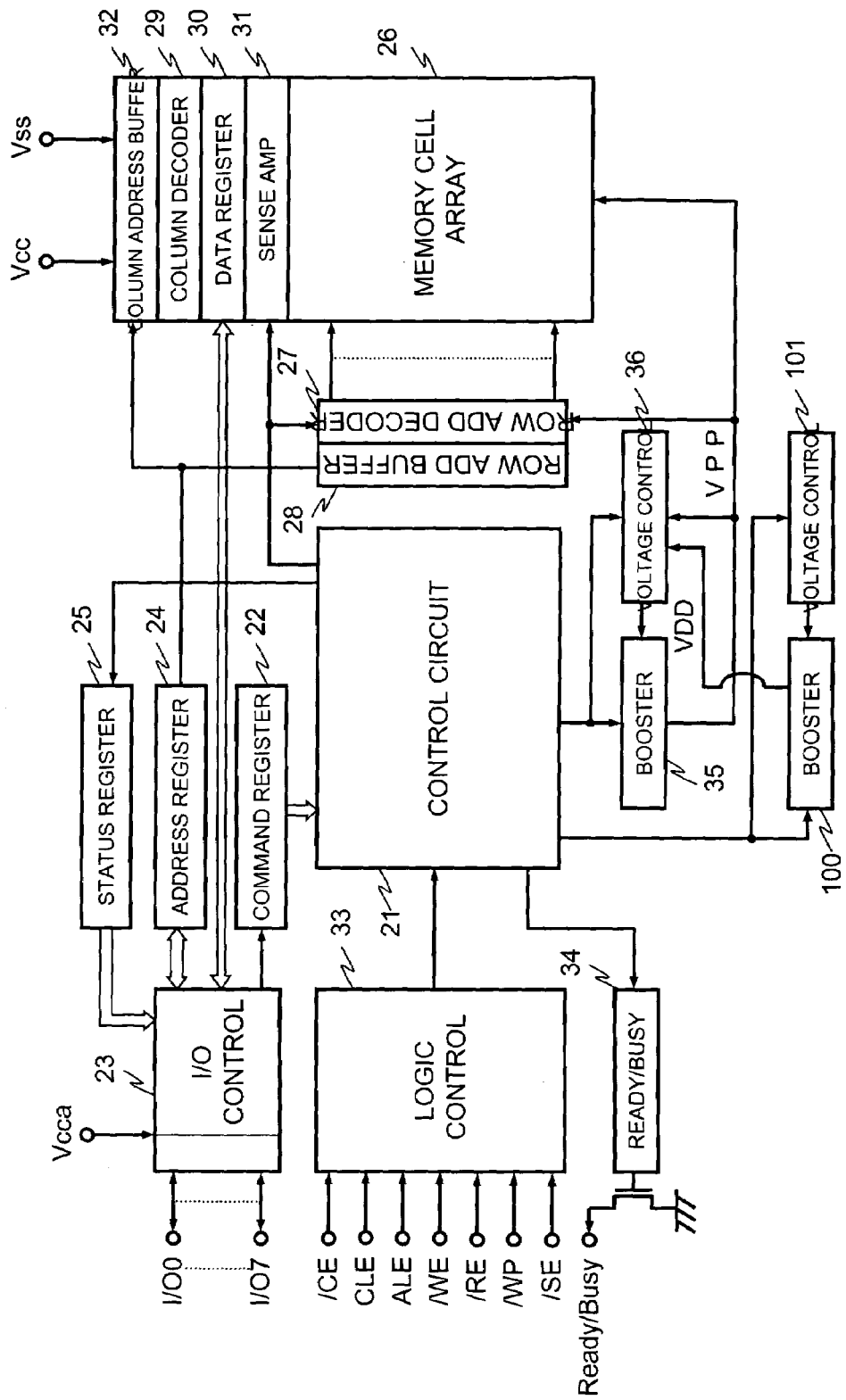
FIG. 2 is a block diagram showing an outline of a semiconductor device according to an embodiment of the present invention.

FIG. 2 is a block diagram of an outline of a semiconductor device according to an embodiment of the present invention. A semiconductor device 20 includes a control circuit 21, a command register 22, an I/O control circuit 23, an address register 24, a status register 25, a memory cell array 26, a row address decoder 27, a row address buffer 28, a column decoder 29, a data register 30, a sense amplifier 31, a column address buffer 32, a logic controller 33, and a ready/busy register 34, an internal booster circuit 35, a voltage control circuit 36, an internal booster circuit 100, and a voltage control circuit 101.

The semiconductor device 20 may be solely packaged into a semiconductor memory device such as a flash memory, or may be incorporated as a part of the semiconductor device such as a system LSI. The logic controller 33 externally receives control signals such as a chip enable signal /CE, a command latch enable signal CLE, an address latch enable signal ALE, a write enable signal /WE, a read enable signal /RE, a write protect signal /WP, a spare area enable signal /SE, and supplies logic control signals based on the received control signals to the control circuit 21.

The I/O control circuit 23 receives and sends input/output signals I/O0-I/O7 from and to the outside of the device. The I/O control circuit externally receives an address signal, a data signal and a command signal, and supplies the address register 24, the data register 30 and the command resistor 22 with the received address signal, data signal and command signal, respectively. The address register 24 supplies the row address buffer circuit 28 with the row address, and supplies the column address buffer 32 with the column address.

The control circuit 21 receives the logic control signal from the logic control circuit 33, and receives a command from the command register 22, and operates as a state machine on the basis of the received logic control signal and command. The state machine controls the operations of the internal parts of the semiconductor device 20. The control circuit 21 controls the memory cell array 26, the row address decoder 27 and the column decoder 29 to read data from the memory cell array 26 with an address indicated by the address register 24.

The control circuit 21 controls the memory cell array 26, the row address decoder 27 and the column decoder 29 to write data in the memory cell array 26 with a write address. The control circuit 21 controls the memory cell array 26, the row address decoder 27 and the column decoder 29 to erase an area in the memory cell array 26 on a given unit basis.

The memory cell array 26 has an array of memory cell transistors, which may have different threshold values, word lines and bit lines. Each memory cell transistor is capable of storing data. At the time of data reading, data is read out to the bit line from a memory cell specified by an activated word line. At the time of programming or erasing, the word line and bit lines are set at respective appropriate voltages, so that the charges are injected into or drawn from the memory cells.

The sense amplifier 31 operates under the control of the control circuit 21, and determines whether data is 0 or 1 by comparing a current supplied from the memory cell in the memory cell array 26 specified by the row address decoder 27 and the column decoder 29 with a reference current. The result of this determination is stored in the data register 30 as read data, and is further supplied to the I/O control circuit 23 from the data register 30.

In the verify operation performed in programming and erasing, the current of data supplied from the memory cell in the memory cell array 26 specified by the row address decoder 27 and the column decoder 29 is compared with a reference current for program verification and erase verification. In the programming operation, write data is stored in the data register 30, and the word line and bit line in the memory cell array 26 are set to potentials based on the write data, so that the charge can be injected into the memory cell. The status register 25 is used to store status information about the operation of the semiconductor device 20. The contents of the status register 25 can be read from the outside of the semiconductor device 20 via the I/O control circuit 23, and may be used to determine whether the device is in the ready state or programming protection mode, or in a state of programming or erasing. The ready/busy register 34 stores a flag that indicates whether the device is in the ready state or the busy state, and a ready/busy signal based on the flag is available from the register 34.

The internal booster circuit 35 generates the boosted voltage VPP for use in programming and erasing from an external voltage. The boosted voltage VPP generated by the internal booster circuit 35 is supplied to the voltage control circuit 36 as well as the row address decoder 27 and the memory cell array 26. The voltage control circuit 36 monitors the boosted potential VPP generated by the internal booster circuit 35, and controls the internal booster circuit 35 so that the boosted voltage VPP can be maintained at the given potential. For example, when the boosted potential is higher than the given potential, the voltage control circuit 36 activates a voltage drop circuit, which decreases the boosted potential by discharging.

The internal booster circuit 100 derives a boosted voltage VDD of, for example, 9 V from an external voltage VCC of, for example, 3 V. The boosted voltage VDD is supplied to the select transistors in the voltage control circuit 36. The voltage control circuit 101 monitors the boosted voltage VDD generated by the internal booster circuit 100, and controls the internal booster circuit 100 so that the boosted voltage VDD can be maintained at a given potential.

Figure 3:
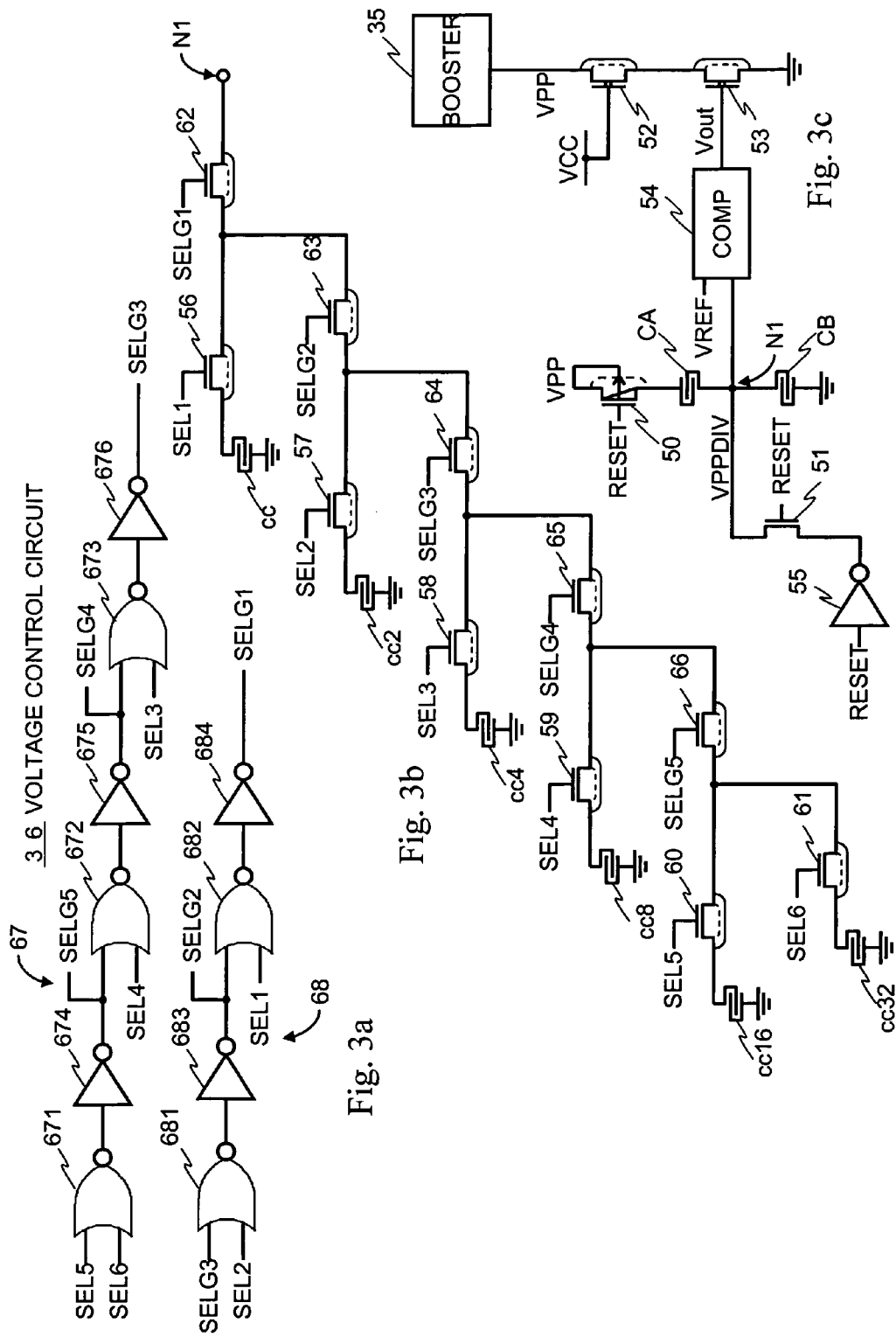
FIG. 3 is made up of FIGS. 3a, 3b and 3c, and is a diagram of a voltage control circuit employed in an embodiment.

The voltage control circuit 36 will now be described. FIG. 3 shows the voltage control circuit 36. As is shown in FIG. 3, the voltage control circuit 36 includes a PMOS transistor 50, NMOS transistors 51 through 53, a comparator circuit 54, an inverter 55, select transistors 56 through 66, capacitors CA and CB, capacitors CC through CC32, and circuits 67 and 68. The voltage control circuit 36 divides the boosted voltage VPP by capacitance, and compares the divided voltage with the reference voltage to control and maintain the boosted voltage at the given voltage.

One ends of the capacitors CA and CB are connected to the node N1, and the other end of the capacitor CA is connected to a boosted voltage (VPP) line via the PMOS transistor 50, the other end of the capacitor CB being connected to a ground voltage line. The capacitors CA and CB form a dividing circuit that divides the boosted potential (first potential) VPP received by one end (first terminal) of the boosted voltage line, and produces the divided potential VPPDIV at the node N1. The capacitor CA is arranged on the high-voltage side of the node N1 at which the divided voltage VPPDIV is available, while the capacitor CB is arranged on the low-potential side thereof. Resistors may be substituted for the capacitors CA and CB. The capacitors CC through CC32 are connected to the node N1 via the select transistors 56 through 66. The capacitor CC has a capacitance CC, and the capacitor CCk (for example, CC16) has a capacitance equal to k×CC (for example, 16CC). The multiple capacitors include a capacitor having a capacitance equal to a power of CC that is the minimum capacitance.

The select transistors 56 through 66 are formed by NMOS transistors. The select transistors 56 through 61 function to connect capacitors to be used among the capacitors CC through CC32 to the node N1. The select transistors 62 through 66 are arranged to connect capacitors to be used among the capacitors 56 through 61 to the node N1. For example, the select transistor 56 that selects the capacitor CC is connected to the node N1 through the associated select transistor 62, and the select transistor 57 that selects the capacitor CC2 is connected to the node N1 via the select transistors 63 and 62. In a case where a capacitance 3CC is connected to the node N1, the transistors 56, 57, 62 and 63 are turned ON, and the remaining transistors are OFF. It is to be noted that the junction capacitance of only the transistor 64 is connected to the node N1 as that of the OFF-state transistor, and the junction capacitances of the other transistors are not connected to the node N1. In this manner, it is possible to minimize the influence of the junction parasitic capacitances Cpara of the select transistors 56 through 61. The gates of the select transistors 56 through 66 are controlled by the signals SEL1 through SEL6 or signals SELG1 through SELG5. The signals SEL1 through SEL6 are supplied from the control circuit 21.

The circuits 67 and 68 are provided to select the capacitor or capacitors to be connected to the node N1 from among the capacitors CC through CC32, and produce the second control signals SELG1 through SELG5 supplied to the select transistors 62 through 66 from the first control signals SEL1 through SEL6 supplied to the select transistors 56 through 61. The circuit 67 includes NOR circuits 671 through 673, and inverters 674 through 676. The inverter 674 receives a signal output by the NOR circuit 671 that performs a NOR operation on the signals SEL5 and SEL6, and derives the signal SELG5 therefrom. The inverter 675 receives a signal output by the NOR circuit 672 that performs a NOR operation on the signals SELG5 and SEL4, and produces the signal SELG4 therefrom. The inverter 676 receives a signal output by the NOR circuit 673 that performs a NOR operation on the signals SELG4 and SEL3, and produces the signal SELG3 therefrom.

The circuit 68 includes NOR circuits 681 and 682, and inverters 683 and 684. The inverter 683 receives a signal output by the NOR circuit 681 that performs a NOR operation on the signals SELG3 and SEL2, and produces the signal SELG2 therefrom. The inverter 684 receives a signal output by the NOR circuit 682 that performs a NOR operation on the signals SELG2 and SEL1, and produces the signal SELG1 therefrom. The divided voltage VPPDIV drops in accordance with the capacitance added to the node N1 in such a manner that the capacitors CC through CC32 are selectively connected to the node N1 by switching the control signals SEL1 through SEL6 or the control signals SELG1 through SELG5.

When the capacitor CC is connected to the node N1, the transistors 56 and 62 are turned ON. When the capacitors CC and CC2 are connected to the node Ni, the select transistors 56, 57, 62 and 63 are turned ON. When the capacitors CC through CC4 are connected to the node N1, the select transistors 56, 57, 58, 62, 63 and 64 are turned ON. When the capacitors CC through CC32 are connected to the node N1, the select transistors 56 through 66 are turned ON. In the present embodiment, the junction parasitic capacitance Cpara is minimized when only the capacitor CC is selected, that is, only the signals SEL1 and SELG1 are switched to the high level. In contrast, the junction parasitic capacitance Cpara is maximized when only the capacitor CC16 or CC32 is selected, that is, SEL5 and SELG1 through SELG5 or the signals SEL6 and SELG1 through SELG5 are switched to the high level. In a case where all the capacitors CC through CC32 are selected, even when all the select transistors are selected, the total capacitance of the capacitors in use is considerably great, so that the influence of the parasitic capacitance can be reduced relatively. That is, as the total capacitance of the capacitors in use becomes larger, the tolerable junction parasitic capacitance Cpara of the select transistors becomes larger.

In the present embodiment, in some cases, a larger number of select transistors may be connected to the node N1 than that used in the conventional circuit. However, the junction capacitance of the transistor in the ON state is much smaller than that in the OFF state. Thus, the boosted voltage VPP is not greatly affected by an increased number of select transistors in the ON state. Thus, the present invention can maintain the boosted voltage VPP for a long time.

Figure 7:
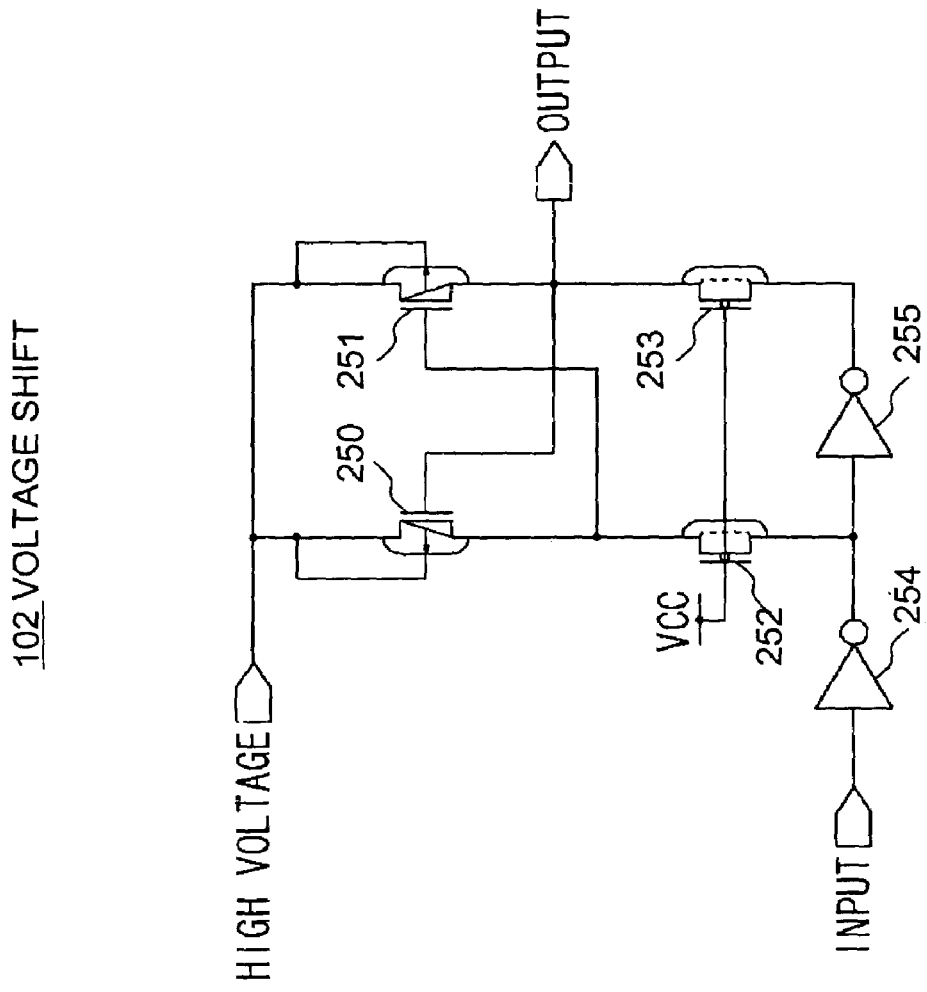
FIG. 7 is a diagram of a voltage shift circuit employed in the embodiment.

In the present embodiment, the reset transistor 51 connected to the node N1 is back-biased. It is thus possible to restrain the leakage current that flows to the ground potential VSS from the node N1 during the time when the voltage is controlled and maintained. The reset transistor 51 resets the node N1 in response to a reset signal, and is back-biased in the absence of the reset signal. It is very effective to minimize the leakage current in order to maintain the boosted voltage VPP for a long time with a precision of mV order. The gates of the select transistors 56 through 66 are controlled by the boosted voltage VDD obtained by boosting the external potential equal to, for example, 3 V. The boosted voltage VDD is supplied from the internal booster circuit 100 as a power source for the voltage shift circuit 102 shown in FIG. 7 and the circuits 67 and 68 shown in FIG. 3. The signal SEL at the VCC level supplied from the control circuit 21 is applied to an input terminal IN of the voltage shift circuit 102, which produces the signal SEL that is at the VDD level. Further, the signal SELG that is at the VDD level is produced from the signal SEL. It is possible to further reduce the junction capacitances of the select transistors 56 through 66 by controlling the gates of the select transistors 56 through 66 by the boosted voltage of 9 V obtained by boosting the power supply voltage VCC of 3 V. The gate of the reset transistor 51 may be controlled by the boosted voltage available by boosting the external voltage VCC.

The comparator circuit 54 compares the divided voltage VPPDIV with the reference voltage VREF, and outputs the resultant signal Vout. When the divided voltage VDPPDIV is higher than the reference voltage VREF, the signal Vout is, for example, high. This means that the boosted voltage is too high, and is thus reduced by discharging. The divided voltage VPPDIV is subjected to feedback control so as to be equal to the reference voltage VREF.

Figure 4:
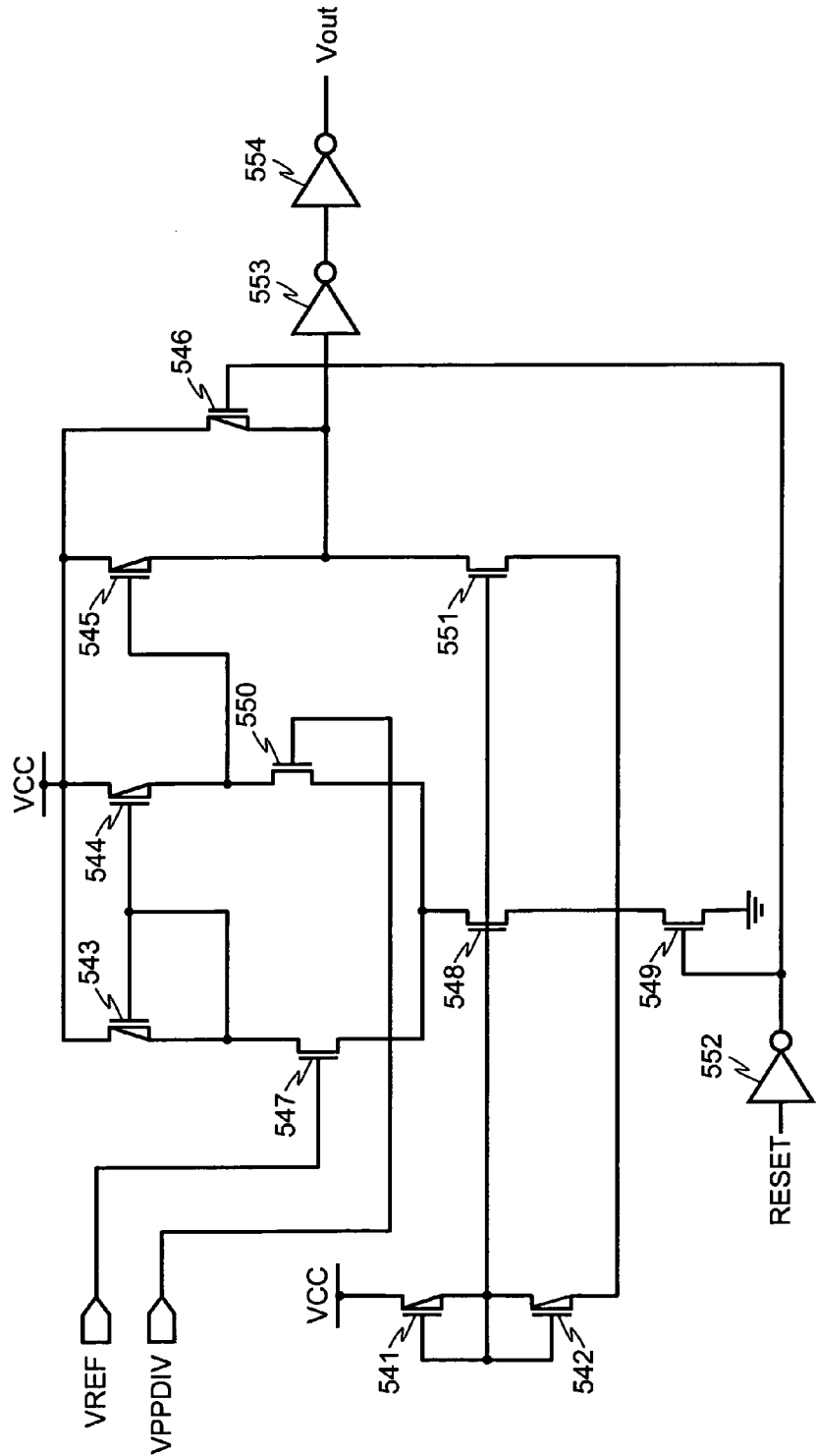
FIG. 4 is a diagram of a comparator circuit employed in the embodiment.

Now, the comparator circuit 54 will be described. FIG. 4 shows the comparator circuit 54 employed in the present embodiment. Referring to FIG. 4, the comparator circuit 54 includes PMOS transistors 541 through 546, NMOS transistors 547 through 551, and inverters 552 through 574. The NMOS transistor 550 is the input transistor that receives the divided voltage VPPDIV shown in FIG. 3. In this structure, when the divided voltage VPPDIV is higher than the reference voltage VREF, the output voltage Vout becomes high by the differential amplification.

Figure 5:
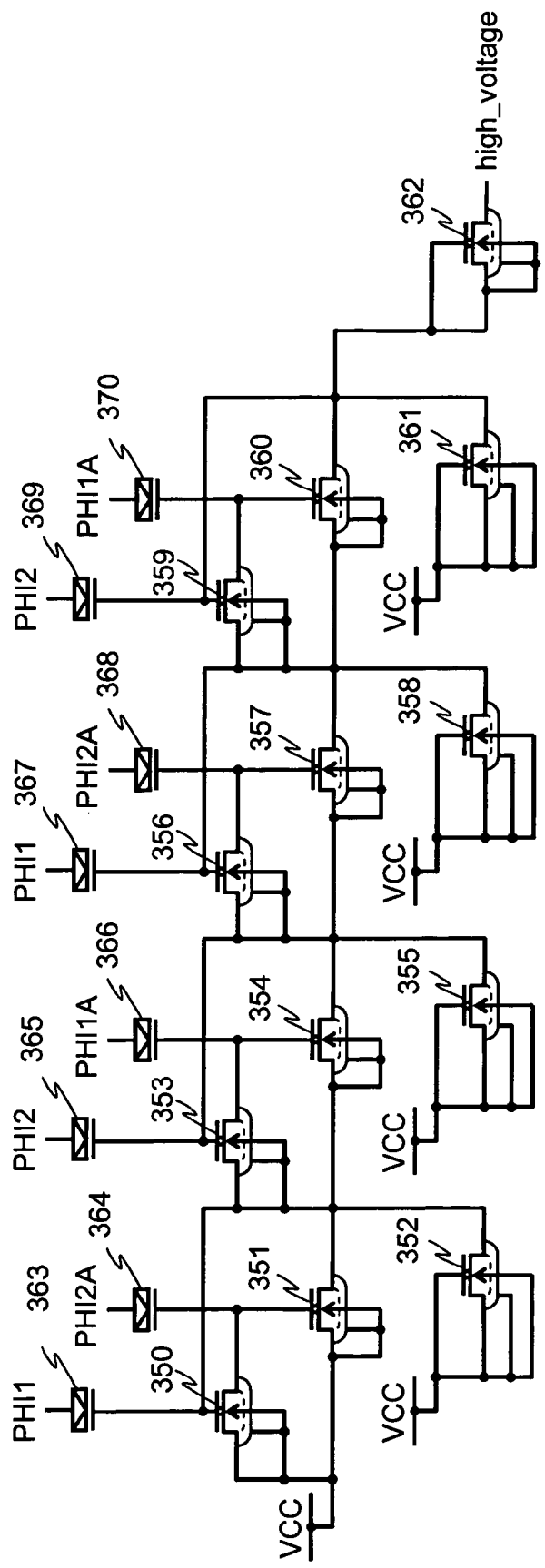
FIG. 5 is a diagram of an internal booster circuit employed in the embodiment.
Figure 6:
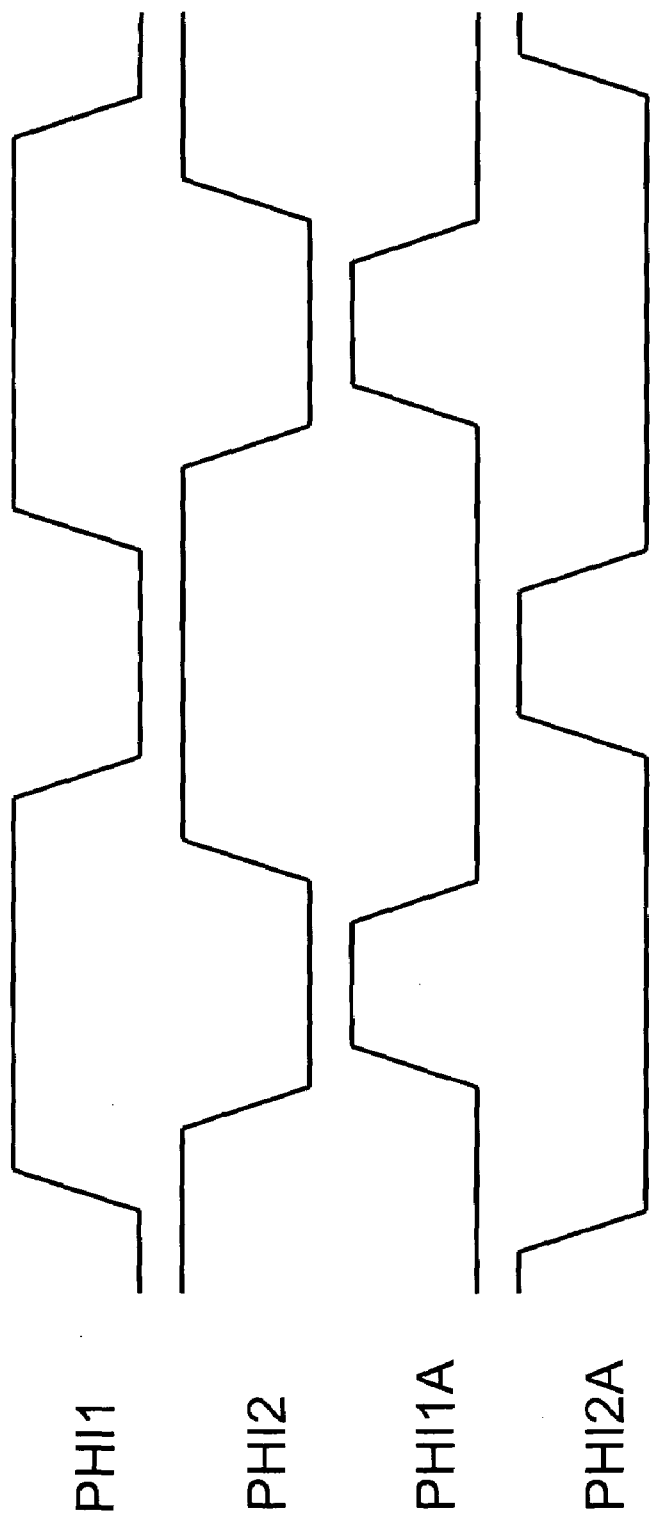
FIG. 6 shows clock waveforms of signals PHI1 through PHI2B.

The internal booster circuit 35 will now be described. FIG. 5 shows the internal booster circuit 35 employed in the present embodiment. FIG. 6 shows clock waveforms of signals PHI1 through PHI2B. As shown in FIG. 5, the booster circuit 35 includes capacitors 363 through 370.

The signals PHI1, PHI2 and PHI1 A through PHI2A are respectively applied to one ends of the capacitors 363 through 370. These signals have slightly different phases for improvement in boosting.

Basic pump cells have pairs of capacitors (363 and 364), (365 and 366), (367 and 368), and (369-370), and three NMOS transistors (350-352), (353-355), (356-358) and (359-361). The boost operation is repetitively carried out from the basic pump cell of the first stage to that of the final stage, and the resultant high voltage is output via a transistor 362, which prevents current from flowing in the reverse direction.

Figure 8:
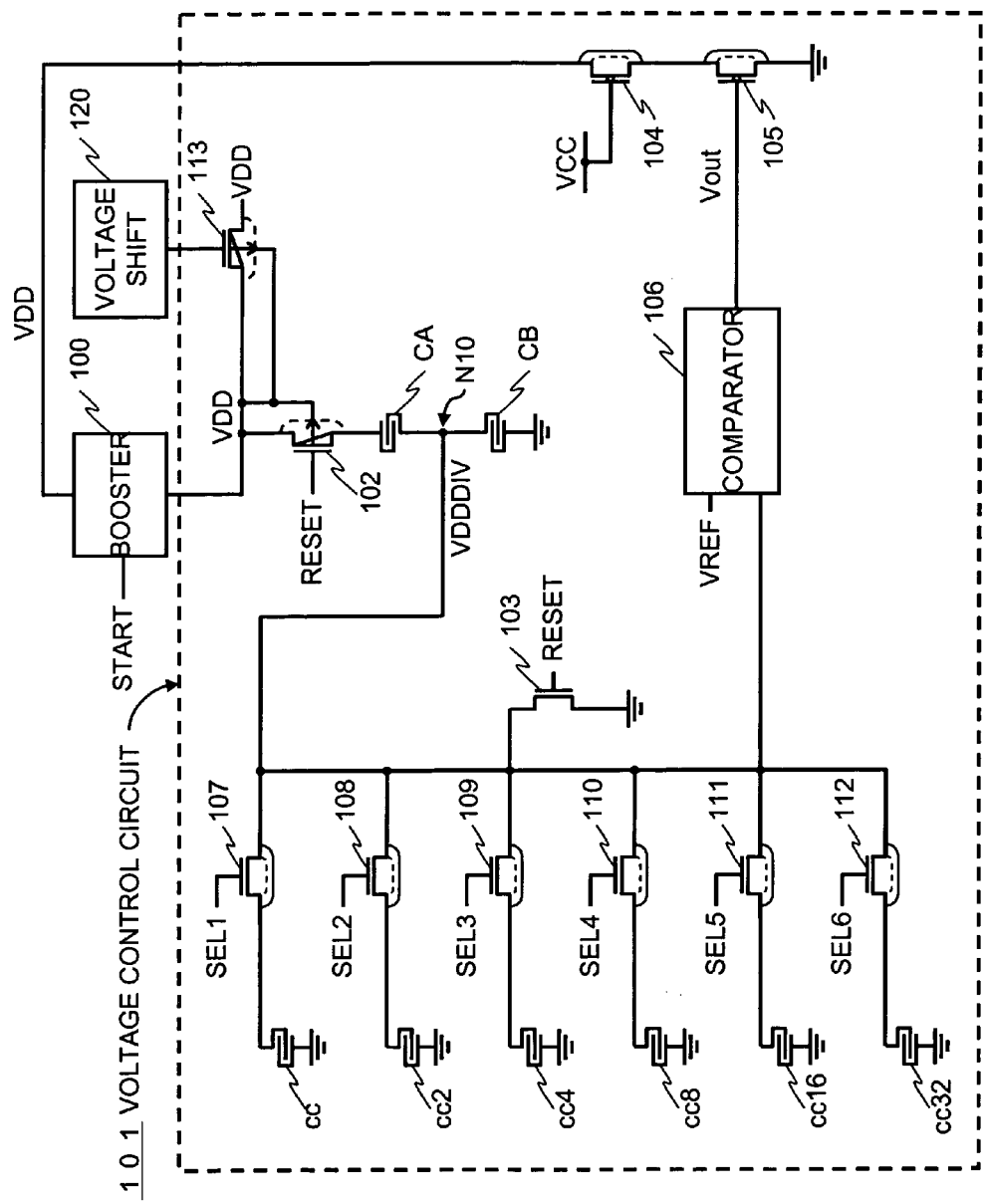
FIG. 8 is a diagram of a voltage control circuit employed in the embodiment.

The voltage control circuit 101 will now be described. FIG. 8 shows the voltage control circuit 101. Referring to this figure, the voltage control circuit 101 includes PMOS transistors 102 and 113, NMOS transistors 103 through 105, a comparator circuit 106, select transistors 107 through 112, the capacitors CA and CB, and the capacitors CC through CC32. The voltage control circuit 101 is connected to the internal booster circuit 100 and a voltage shift circuit 120.

The divided voltage VDDDIV is generated by capacitance division of the boosted voltage VDD, and is applied to the comparator circuit 106. The comparator circuit 106 compares the divided voltage VDDDIV with the reference voltage VREF, and outputs the resultant signal Vout. When the divided voltage VDDDIV is higher than the reference voltage VREF, the signal Vout becomes high, for example. This means that the boosted voltage VDD is too high, and is thus decreased by the discharge operation. The gate of the PMOS transistor 113 is controlled by the voltage shift circuit 120, which has a configuration similar to the voltage shift circuit 102 shown in FIG. 7. More particularly, the voltage shift circuit 120 includes PMOS transistors 250 and 251, NMOS transistors 252 and 253 and inverters 254 and 255.

The gates of the select transistors 56 through 66 of the voltage control circuit 36 are controlled by the boosted voltage VDD from the PMOS transistor 113. The junction parasitic capacitances of the select transistors 56 through 66 can be further reduced by controlling the gates of the select transistors 56 through 66 of the voltage control circuit 36 to the boosted voltage equal to, for example, 9 V higher than the power supply voltage VCC equal to, for example, 3 V. The internal booster circuit 100 may be configured like the internal booster circuit 35 shown in FIG. 5, and a description thereof is omitted here.

The following advantages are brought about by the present invention. The booster voltage VPP may be used for various applications such as programming and erasing and may have various values. A multi-bit cell type of devices has frequently employs a process of boosting the boosted voltage VPP stepwise for each pulse in programming. This process needs a large number of capacitors and a large number of associated select transistors. As the number of select transistors increases, the boosted voltage VPP greatly deviates from the target value calculated due to the increased junction parasitic capacitance. In addition, it becomes more difficult to maintain the boosted voltage at the given fixed level for a long time.

An increased total capacitance of the capacitors needs a larger size of the reset transistor. A fine leakage current that flows through the reset transistor in the OFF state makes it difficult to maintain the boosted voltage VPP for a long time. An aspect of the present invention minimizes the number of select transistors by the unique connection arrangement and solves the problems about the parasitic capacitance and the junction leakage. Further, according to another aspect of the present invention, the reset transistor is back-biased to minimize the leakage current and maintain the boosted voltage VPP for a longer period of time.

It is noted the transistors 56 through 61 may be referred to as first switches, and the transistors 62 through 66 may be referred to as second switches.

The preferred embodiments of the present invention have been described. The present invention is not limited to the specifically disclosed embodiments, and variations and modifications may be made without departing from the scope of the present invention.

What is claimed is:

1. A voltage control circuit comprising:
   capacitors;
   first switches that are respectively provided to the capacitors and selectively couple the capacitors with a given node; and
   second switches that are respectively provided between the first switches and the given node and selectively connect the first switches to the given node;
   wherein:
   one of the first switches that selectively couples one of the capacitors with the given node is coupled with the given node via a corresponding one of the second switches; and
   another one of the first switches that selectively couples another one of the capacitors with the given node is coupled to the given node via one of the second switches associated with said another one of the first switches and the corresponding one of the second switches.

2. The voltage control circuit as claimed in claim 1, further comprising a control circuit generating second control signals applied to the second switches from first control signals applied to the first switches.

3. The voltage control circuit as claimed in claim 1, further comprising a control circuit generating second control signals applied to the second switches from first control signals applied to the first switches so that the first and second switches select capacitors to be connected to the given node from among the capacitors.

4. The voltage control circuit as claimed in claim 1, wherein the capacitors include a capacitor having a minimum capacitance and capacitors having capacitances equal to powers of the minimum capacitance.

5. A voltage control circuit comprising:
   capacitors;
   first switches that are respectively provided to the capacitors and selectively couple the capacitors with a given node; and
   second switches that are respectively provided between the first switches and the given node and selectively connect the first switches to the given node;
   wherein each of the first and second switches includes a transistor having a gate that is set at a potential defined by boosting an external voltage.

6. The voltage control circuit as claimed in claim 5, further comprising a voltage dividing circuit that applies, to the given node, a given voltage obtained by dividing a first potential applied to a first terminal.

7. A voltage control circuit comprising:
   capacitors;
   first switches that are respectively provided to the capacitors and selectively couple the capacitors with a given node; and
   second switches that are respectively provided between the first switches and the given node and selectively connect the first switches to the given node;
   further comprising a voltage dividing circuit that applies, to the given node, a given voltage obtained by dividing a first potential applied to a first terminal, wherein the voltage dividing circuit comprises a transistor coupled between the first potential and the given node.

8. A voltage control circuit comprising:
   capacitors;
   first switches that are respectively provided to the capacitors and selectively couple the capacitors with a given node; and
   second switches that are respectively provided between the first switches and the given node and selectively connect the first switches to the given node;
   further comprising a reset circuit that resets the given node in response to a reset signal.

9. The voltage control circuit as claimed in claim 8, wherein the reset circuit comprises a reset transistor that resets the given node in response to a reset signal, wherein the reset transistor is backward-biased in the absence of the reset signal.

10. A voltage control circuit comprising:
    capacitors;
    first switches that are respectively provided to the capacitors and selectively couple the capacitors with a given node; and
    a reset transistor that resets the given node in response to a reset signal, the reset transistor being back-biased in the absence of the reset signal.

11. The voltage control circuit as claimed in claim 10, wherein the first switches respectively comprise first transistors having gates to which a gate voltage is applied, the gate voltage being derived from an external voltage and being higher than the external voltage.

12. The voltage control circuit as claimed in claim 10, wherein the reset transistor has a gate to which a gate voltage is applied, the gate voltage being derived from an external voltage and being higher than the external voltage.

13. A method comprising the steps of:
controlling first switches that are provided for capacitors and selectively connect the capacitors to a given node; and
controlling second switches that are provided between the first switches and the given node and connecting the first switches to the given node;
further comprising a step of back-biasing a reset transistor that resets the given node in response to a reset signal when the reset signal is not applied thereto.

14. The method as claimed in claim 13, further comprising a step of producing, from a first control signal applied to the first switches, a second control signal applied to the second switches.

15. The method as claimed in claim 13, further comprising a step of setting gates of transistors included in the first and second switches to a potential defined by boosting an external voltage.

16. A method comprising the steps of:
controlling first switches that are provided for capacitors and selectively connect the capacitors to a given node; and
back-biasing a reset transistor that resets the given node in response to a reset signal when the reset signal is not applied thereto.

* * * * *